United States Patent
Schweitzer, III et al.

(10) Patent No.: US 11,125,821 B2
(45) Date of Patent: Sep. 21, 2021

(54) TESTING DEVICE FOR PROTECTIVE RELAYS IN ELECTRIC POWER DELIVERY SYSTEMS

(71) Applicant: Schweitzer Engineering Laboratories, Inc., Pullman, WA (US)

(72) Inventors: Edmund O. Schweitzer, III, Pullman, WA (US); David E. Whitehead, Pullman, WA (US); Tony J. Lee, Henderson, NV (US); David J. Casebolt, Moscow, ID (US); Krishnanjan Gubba Ravikumar, Pullman, WA (US); David Schmidt, Athens, GA (US); Austin Edward Wade, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/835,450

(22) Filed: Mar. 31, 2020

(65) Prior Publication Data

US 2021/0109156 A1   Apr. 15, 2021

Related U.S. Application Data

(60) Provisional application No. 62/914,445, filed on Oct. 12, 2019.

(51) Int. Cl.
*G01R 31/327* (2006.01)
*H01H 47/00* (2006.01)
*H02H 1/00* (2006.01)

(52) U.S. Cl.
CPC ..... *G01R 31/3278* (2013.01); *G01R 31/3274* (2013.01); *H01H 47/001* (2013.01); *H01H 47/002* (2013.01); *H02H 1/0061* (2013.01)

(58) Field of Classification Search
CPC ......... H04L 1/00; H04L 2201/00; G06N 3/00; H02J 1/00
See application file for complete search history.

(56) References Cited

U.S. PATENT DOCUMENTS

| | | |
|---|---|---|
| 6,396,279 B1 | 5/2002 | Gruenert |
| 6,608,493 B2 | 8/2003 | Hensler |
| 6,795,789 B2 | 9/2004 | Vandiver |

(Continued)

OTHER PUBLICATIONS

PCT/US2020/053174 International Search Report and Written Opinion of the International Searching Authority dated Dec. 31, 2020.
(Continued)

*Primary Examiner* — Jermele M Hollington
*Assistant Examiner* — Temilade S Rhodes-Vivour
(74) *Attorney, Agent, or Firm* — Gregory C. Baker; Richard M. Edge (57) ABSTRACT

Systems and methods for testing a protection relay, such as a primary bus protection relay, may include a testing device for providing current signals imitating current on both sides of a bus to the primary bus protection relay. The signals may be provided using signals corresponding with a signal format from merging units or other monitoring devices. The testing device may be configured to receive communications from the primary bus protection relay for evaluation of the operation of the primary bus protection relay.

21 Claims, 7 Drawing Sheets

(56) References Cited

U.S. PATENT DOCUMENTS

| | | |
|---|---|---|
| 6,847,297 B2 | 1/2005 | Lavoie |
| 6,892,115 B2 | 5/2005 | Berkcan |
| 6,892,145 B2 | 5/2005 | Topka |
| 6,909,942 B2 | 6/2005 | Andarawis |
| 6,985,784 B2 | 1/2006 | Vandevanter |
| 6,999,291 B2 | 2/2006 | Andarawis |
| 7,012,421 B2 | 3/2006 | Lavoie |
| 7,043,340 B2 | 5/2006 | Papallo |
| 7,058,481 B2 | 6/2006 | Jiang |
| 7,058,482 B2 | 6/2006 | Fletcher |
| 7,068,483 B2 | 6/2006 | Papallo |
| 7,068,612 B2 | 6/2006 | Berkcan |
| 7,111,195 B2 | 9/2006 | Berkcan |
| 7,117,105 B2 | 10/2006 | Premerlani |
| 7,151,329 B2 | 12/2006 | Andarawis |
| 7,254,001 B2 | 8/2007 | Papallo |
| 7,259,565 B2 | 8/2007 | Diercks |
| 7,262,943 B2 | 8/2007 | Stellato |
| 7,301,738 B2 | 11/2007 | Pearlman |
| 7,460,590 B2 | 12/2008 | Lee |
| 7,532,955 B2 | 5/2009 | Dougherty |
| 7,636,616 B2 | 12/2009 | Fletcher |
| 7,693,607 B2 | 4/2010 | Kasztenny |
| 7,747,354 B2 | 6/2010 | Papallo |
| 7,747,356 B2 | 6/2010 | Andarawis |
| 7,986,503 B2 | 7/2011 | Papallo |
| 8,024,494 B2 | 10/2011 | Soed |
| 8,213,144 B2 | 7/2012 | Papallo |
| 8,560,255 B2 | 10/2013 | Elwarry |
| 8,891,963 B2 | 11/2014 | Patel |
| 9,366,711 B2 | 6/2016 | Klapper |
| 9,632,147 B2 | 4/2017 | Hensler |
| 9,819,611 B2 | 11/2017 | Snowdon |
| 10,178,047 B2 | 1/2019 | Chapman |
| 10,379,991 B2 | 8/2019 | Yang |
| 2002/0116092 A1 | 8/2002 | Hamamatsu |
| 2002/0173927 A1 | 11/2002 | Vandiver |
| 2003/0048508 A1 | 3/2003 | Yu |
| 2005/0107977 A1 | 5/2005 | Edwards |
| 2006/0052905 A1* | 3/2006 | Pfingsten ............ H05K 7/1484 700/286 |
| 2009/0012728 A1 | 1/2009 | Spanier |
| 2009/0296583 A1 | 12/2009 | Dolezilek |
| 2010/0040068 A1 | 2/2010 | Wimmer |
| 2010/0183298 A1 | 7/2010 | Biegert |
| 2010/0328883 A1* | 12/2010 | Ledezma ............ H05K 7/1432 361/690 |
| 2011/0148214 A1* | 6/2011 | Dahlen ............ H02J 13/00007 307/87 |
| 2012/0126623 A1* | 5/2012 | Koehl ................ H02J 3/388 307/76 |
| 2013/0234696 A1* | 9/2013 | Bryson ................ G06F 1/26 323/340 |
| 2014/0233160 A1* | 8/2014 | Ferri ................ H02B 5/00 361/627 |
| 2016/0013632 A1 | 1/2016 | Lloyd |
| 2017/0026291 A1 | 1/2017 | Smith |
| 2017/0288950 A1 | 10/2017 | Manson |
| 2018/0034689 A1 | 2/2018 | Kanabar |
| 2018/0089057 A1 | 3/2018 | Yang |
| 2018/0348267 A1 | 12/2018 | Yang |

OTHER PUBLICATIONS

David Costello: Understanding and Analyzing Event Report Information, Oct. 2000.

Joe Perez: A Guide to Digital Fault Recording Event Analysis, 2010.

Considerations for Use of Disturbance Recorders; a Report to the System Protection Subcommittee of the Power System Relaying Committee of the IEEE Power Engineering Society, Dec. 27, 2006.

David Costello: Event Analysis Tutorial, Part 1: Problem Statements 2011.

Jane Starck, Antti Hakala-Ranta, Martin Stefanka, Switchgear Optimization Using IEC 61850-9-2 and Non-Conventional Measurements May 23, 2012.

Will Allen, Tony Lee: Flexible High-Speed Load Shedding Using a Crosspoint Switch Oct. 2005.

Qiaoyin Yang, Rhett Smith: Improve Protection Communications Network Reliability Throught Software-Defined Process Bus, Jan. 2018.

Caitlin Martin, Steven Chase, Thanh-Xuan Nguyen, Dereje Jada Hawaz, Jeff Pope, Casper Labuschagne: Bus Protection Considerations for Various Bus Types; Oct. 2013.

\* cited by examiner

TESTING DEVICE FOR PROTECTIVE RELAYS IN ELECTRIC POWER DELIVERY SYSTEMS

RELATED APPLICATION

This application claims priority to U.S. Provisional Patent Application No. 62/914,445, filed Oct. 12, 2019, the entirety of which is incorporated herein by reference.

TECHNICAL FIELD

This disclosure relates to a testing device for primary protective relays in an electric power delivery system. More particularly, this disclosure relates to testing of multiple-input primary protective relay using a testing device for applying signals to simulate disparate power system equipment.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric power delivery systems are widely used to generate, transmit, and distribute electric power to loads, and serve as an important part of the critical infrastructure. Power systems and components are often monitored and protected by intelligent electronic devices (IEDs) and systems of IEDs that obtain electric power system information from the equipment and provide protective actions, monitor, and automate the power system. Several IEDs may be in communication to facilitate sharing of information for station-wide, area-wide, or even system-wide protection.

It is recognized that modern electric power protection systems are integrated with automation, monitoring, and supervisory systems that may rely on digital communication. IEDs perform numerous protection, automation, monitoring, and metering tasks that require proper settings and communications between IEDs and among IEDs and other devices. Such systems of IEDs are highly engineered for the proper functioning of the devices individually and the system as a whole. To ensure proper configuration, each device is tested at the time of setting and commissioning, and thereafter as needed in accordance with a testing and maintenance schedule, as well as when devices or equipment are replaced or updated, and when new devices or equipment are added to the system. Testing of IEDs and systems of IEDs may require a significant amount of time and testing equipment, and may require taking portions of the electric power delivery system and the system of IEDs out of service during the testing procedure.

Embodiments of the present disclosure include improved systems for protecting, automating, and monitoring electric power delivery systems, that can be set, commissioned, and tested in less time and with fewer resources. For example, embodiments of the present disclosure may enable setting, commissioning, and testing of protection devices and systems of devices in a relatively more simple manner, which may require less equipment to implement.

Described herein are devices, systems of devices, and testing devices for simplified testing of protection devices. Embodiments of the testing devices described herein may require fewer devices and less time to perform setting, commissioning, and testing of protection devices and systems.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. In addition, data being tied or rendered together in a database record may be resident in the same memory device, or across several memory devices, and may be linked together in fields of a record in a database across a network. Embodiments may be provided as a computer program product including a non-transitory computer and/or machine-readable medium having stored thereon instructions that may be used to program a computer (or other electronic device) to perform processes described herein.

Figure 1:
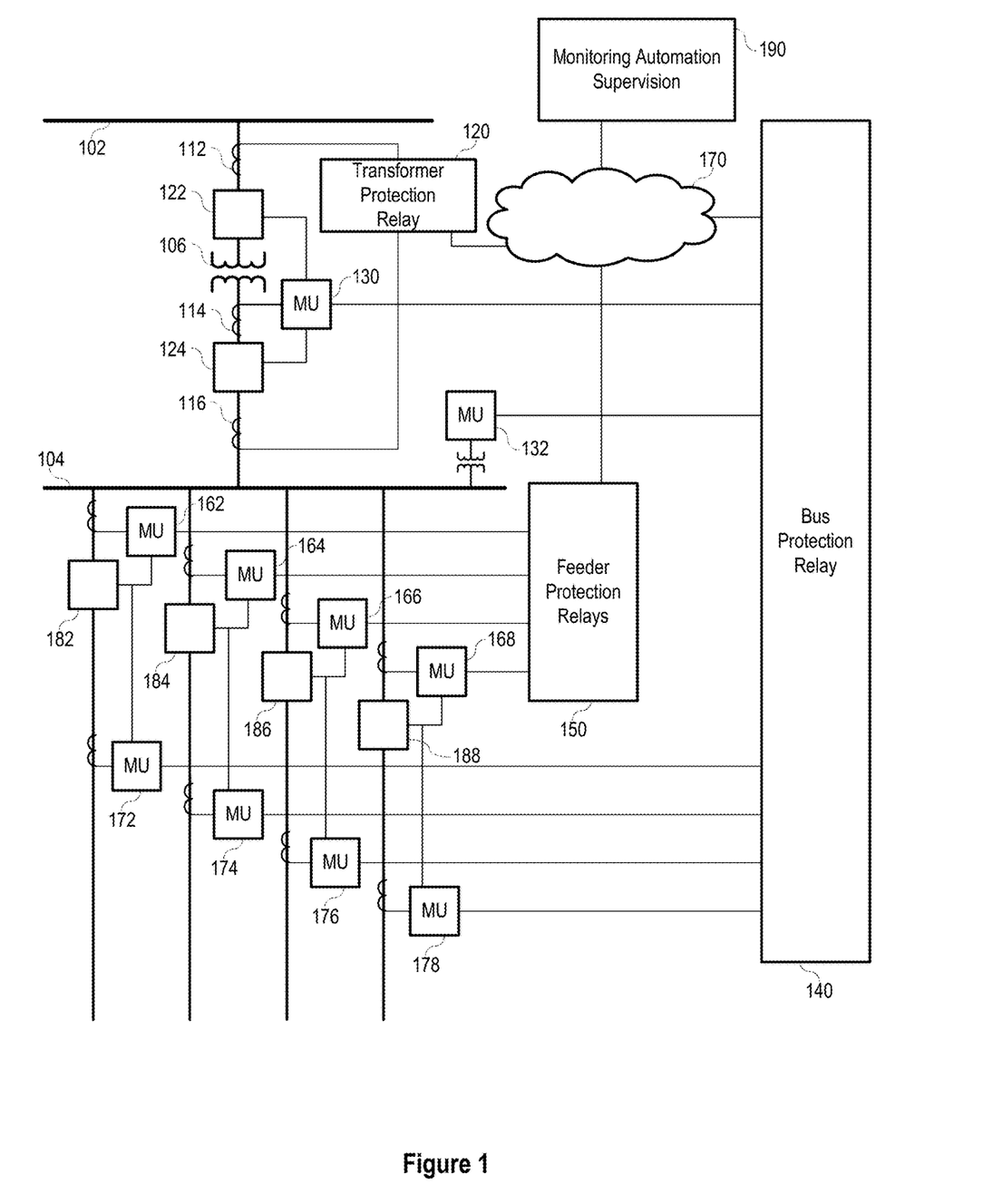
FIG. 1 illustrates a simplified one-line diagram of an electric power delivery system for providing electric power to loads including a system of traditional intelligent electronic devices (IEDs) and relays for protection and automation.

FIG. 1 illustrates a simplified one-line diagram of an electric power delivery system. It should be noted that the system may include multiple phases and additional equipment and complexity. Also illustrated is a system of IEDs that obtain electric power system information from merging units (MUs), and effect control actions on the electric power system using MUs to provide protection and automation to the electric power delivery system. The power system includes various equipment such as a bus 102 (illustrated as a transmission bus) providing electric power to a second bus 104 (illustrated as a distribution bus) via a transformer 106 for stepping down the power from a high (transmission) voltage to a lower (distribution) voltage. Various feeders extend from the second bus 104 for delivering electric power to distributed loads. Circuit breakers 122, 124, 182, 184, 186, 188 may be used to selectively connect and disconnect portions of the power system for various purposes such as reconfiguration, protection in the event of a fault, or the like.

A bus protection relay 140 may be an IED configured to determine operating conditions on a zone that includes the second bus 104 and provide signals to effect a protection operation upon determination of an adverse condition. IED 140 may obtain current signals related to electric power entering the bus 104 from MU 130, voltages from bus 104 using MU 132, and current signals related to electric power leaving bus 104 on the feeders from MUs 172, 174, 176, and 178. IED 140 may be configured to provide differential protection, overvoltage protection, and various other protection for zone including the bus 104.

A feeder protection relay may be an IED 150 that obtains bus voltage signals from MU 132 and current signals related to the feeders from MUs 162, 164, 166, and 168. IED 150 may provide overcurrent, directional, distance, overfrequency, underfrequency, and other protection to the feeders. Feeder protection relays (IED 150) may communicate with bus protection relay 140 via network 170.

A transformer relay may be an IED 120 configured to provide protection to the transformer 106. IED 120 may obtain current signals from both sides of the transformer 106 from MUs or even directly from current transformers (CTs) 112 and 116. IED 120 may further provide information to IED 140 (e.g. via communications network 170). IED 120 may be configured to provide differential protection, overcurrent protection, overfrequency protection, underfrequency protection, and other various protection for the transformer 106.

MUs may be in communication with various circuit breakers 122, 124, 182, 184, 186, and 188 to provide signals to the circuit breakers and receive status information from the circuit breakers. Upon receiving an "open" signal from an IED, the MUs may be configured to signal related circuit breakers to open. For example, upon detection of an overcurrent condition on the first feeder, IED 150 may be configured to signal MU 162 to open breaker 182 to remove current from the faulted feeder.

In various embodiments, the IEDs may be in communication with a monitoring, automation, or other supervisory system or device 190, such as a SCADA system. Such communications may be facilitated over communications network 170. Communications architecture as illustrated are highly engineered, and present multiple possible points of failure and attack. As mentioned above, a failure in communications or a cyber-attack on the system may affect the bus protection relay 140, feeder protection relay 150, or transformer relay 120 resulting in disruption of the protection of the power system.

Figure 2:
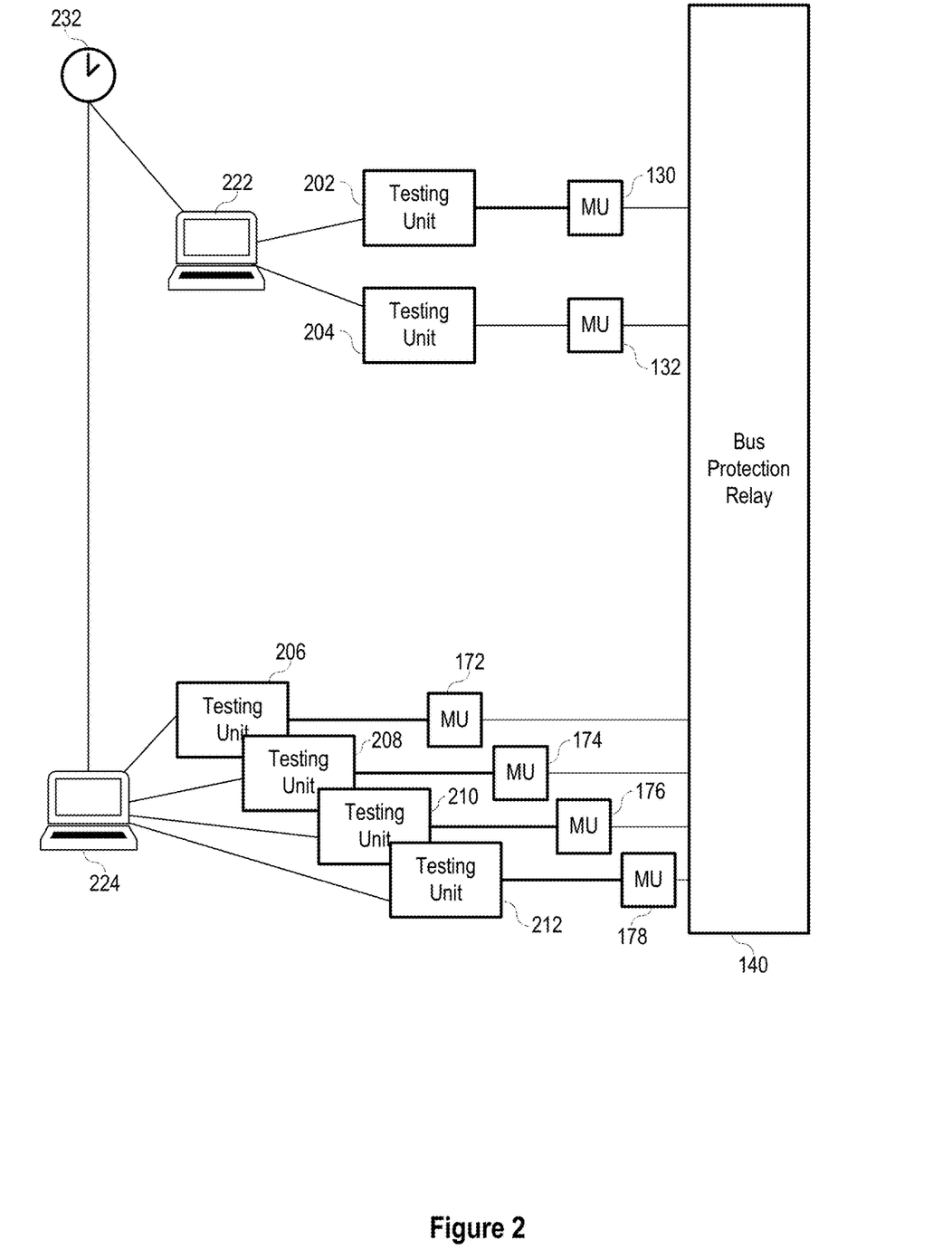
FIG. 2 illustrates a simplified block diagram for testing a bus protection relay in the electric power delivery system of FIG. 1.

FIG. 2 illustrates a simplified block diagram of a system for testing a device such as the bus protection relay 140 of FIG. 1. The bus protection relay 140 may require such current and/or voltage signals to perform differential protection and other operations for the zone between merging unit 130 and merging units 172-178. In order to test the operations of the bus protection relay 140, known signals are injected into the merging units 130, 132, and 172-178, and the response from the bus protection relay 140 is monitored. In particular, the testing system includes a number of testing units 202, 204, 206, 208, 210, 212 configured to provide electrical signals to the merging units 130, 132, 172, 174, 176, 178, which in turn provide digitized analog signals corresponding with those electrical signals to the bus protection relay 140. Command outputs from the bus protection relay 140 are made to particular merging units, which in turn signal the corresponding testing unit.

Merging units are often located in the vicinity of the primary equipment, whereas the bus protection relay 140 is typically located in a control house. Further, primary equipment monitored by the bus protection relay 140 are often located some distance from each other, even on the order of thousands of feet. Accordingly, to inject signals into the subject merging units, what is needed is either very long cables from a single testing unit, or as illustrated, multiple testing units 202-212 located proximate to the subject merging units 130, 132, and 172-178. The testing units 202-212 may be controlled by one or more controllers 222, 224. With the distance between the testing units, multiple controllers 222, 224 may be necessary. Time-coordination of the injected signals may be necessary for proper testing of the protection functions of the bus protection relay 140. For the injected signals to be time coordinated, the controllers may receive a common time signal from a common time source 232.

As can be seen, for proper differential testing of a bus protection relay 140, several testing units, multiple controllers, and a common time source are generally needed. To perform the test, several merging units must be disconnected from the power system and connected to the testing units. With the number of devices and connections required for testing as illustrated, there is an increased likelihood of error. Embodiments of the present disclosure include improved system for protecting an electric power delivery system, and a testing system that requires less equipment and time.

Figure 3:
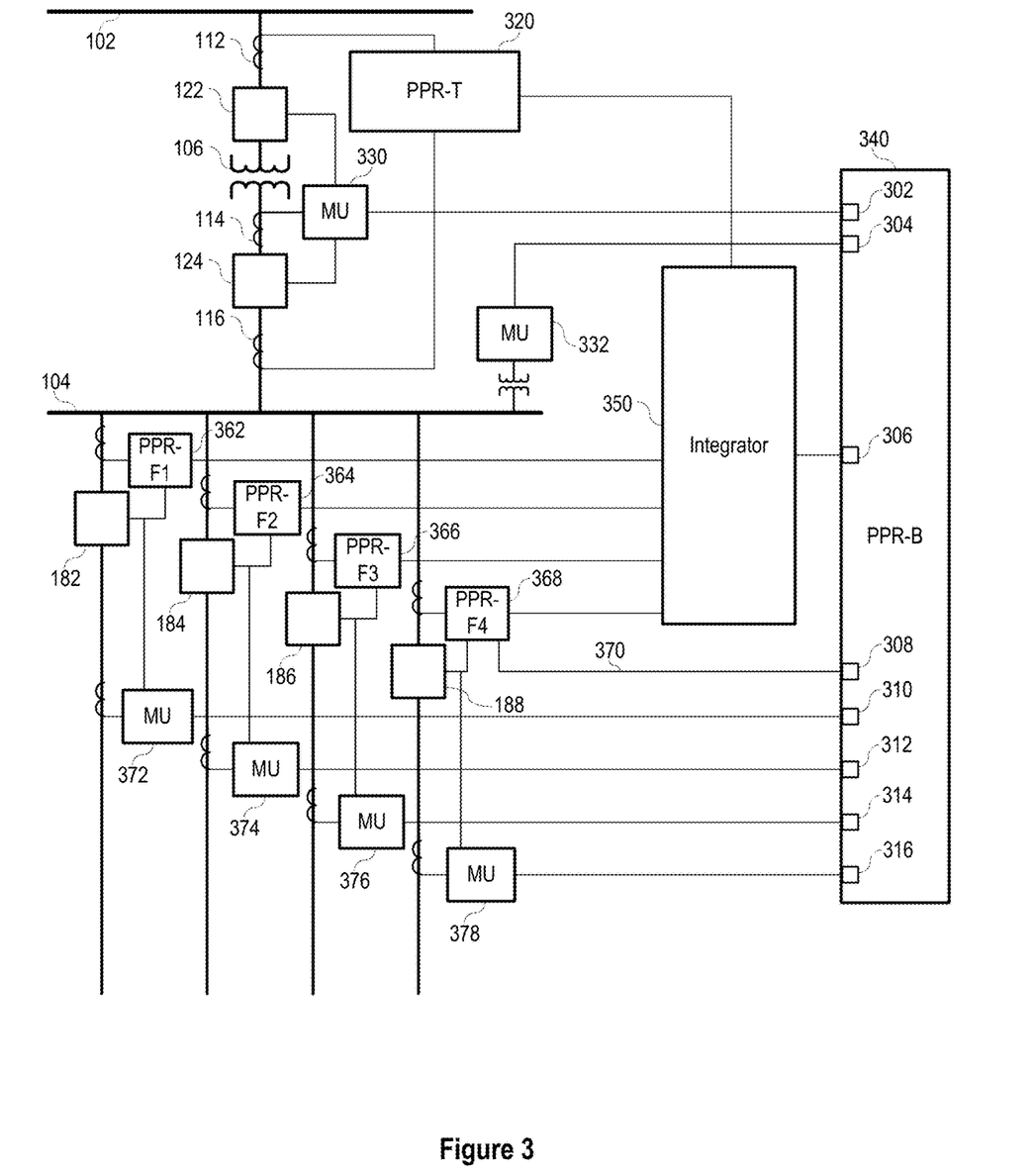
FIG. 3 illustrates a simplified one-line diagram of an electric power delivery system for providing electric power to loads including primary protection relays and an integration system in accordance with embodiments of the disclosure.

FIG. 3 illustrates a simplified one-line diagram of an electric power delivery system that may be similar to the system illustrated in FIG. 1, including a protection system in accordance with the present disclosure. In particular, the protection system includes various primary protection relays: primary transformer protection relay PPR-T 320, primary bus protection relay PPR-B 340, primary feeder protection relays PPR-F1 362, PPR-F2 364, PPR-F3 366, and PPR-F4 368, that do not depend on communication with an automation, monitoring, or supervisory system to continue providing critical protection to the electric power delivery system equipment. Such primary protection relays may be used to separate primary protection functions from other functions traditionally performed by IEDs. Communications among primary protection relays may be facilitated by integrator 350.

Feeders from bus 104 may be protected using feeder relays PPR-F1 362, PPR-F2 364, PPR-F3 366, and PPR-F4 368. Feeder relays 362-368 may obtain current signals from respective feeders using CTs and/or merging units such as MUs 372, 374, 376, 378. Feeder relays 362-368 may further obtain voltage signals from the bus using a potential transformer (PT) and/or a merging unit such as MU 332. Using the current and/or voltage signals, the feeder relays 362-368 may determine operating conditions on the respective feeders including, for example: phase overcurrent; ground overcurrent; neutral overcurrent; negative sequence overcurrent; arc flash; overvoltage; undervoltage; directional power; overfrequency; underfrequency; rate-of-change-of-frequency; fault direction; fault distance; and the like. In the event of a condition determined outside of predetermined operating conditions, the feeder relay 362-368 may be configured to send an open (or trip) or close command to an associated circuit breaker, thus effecting a protective action on the electric power delivery system.

Feeder relays 362-368 may be in communication with respective circuit breakers 182, 184, 186, 188 as illustrated. In various embodiments, the feeder relays 362-368 may be in direct communication with the circuit breakers 182-188 as illustrated. In various other embodiments, the feeder relays 362-368 may be in communication with the circuit breakers 182-188 via merging units such as MUs 372-378. Accordingly, feeder relays 362-368 may provide protection to the feeders using measurements from the power system, using the measurements in one or more protective elements, and effecting a protective action by commanding a circuit breaker to open or close.

The protection system may include an integrator 350 in communication with various devices and equipment in the electric power delivery system. The integrator 350 may perform monitoring, automation, supervisory, communication, secondary (non-critical, backup, or the like) protection, and other functions. As illustrated, the primary protective relays (such as, for example, the transformer relay 320 and the feeder relays 362-368) may be in communication with the integrator 350. According to various embodiments, the primary protective relays may transmit sample values, states, and commands to the integrator 350 useful for its monitoring, automation, backup, supervisory, and other functions, and for communication to other primary protective relays. The primary protective relays may transmit such communications in accordance with a predetermined communication protocol. In various embodiments, the protocol includes an identification of the primary protection relay that is sending the communication, and a payload of the predetermined set of signal values, states, and commands. The payload may vary depending on the type of primary protection relay (feeder protection relay, transformer protection relay, bus protection relay, or the like). A user may apply settings to the primary protection relay governing which signal values, states, and commands are transmitted. Primary protection relays may be configured to transmit such communications in accordance with a predetermined schedule. Primary protection relays may continuously send such communications regardless of a change in state or command.

As mentioned above, each primary protection relay is configured to perform critical protection functions for the equipment monitored thereby with or without communications with the integrator 350, other primary protection relays, or IEDs. For example, the transformer relay PPR-T 320 may perform overcurrent protection, overvoltage protection, undervoltage protection, and differential protection for the transformer 106 using signals obtained from the equipment regardless of communication with the integrator 350 or other devices. Further automation, control, and protection functions may be performed using signals from other primary protection relays or supervisory systems received by transformer relay 320 via the integrator 350. For example, in the case of a failure to open of one of the feeder breakers, the responsible primary protective relay of the feeder may provide a breaker failure signal to the integrator 350. The integrator 350 may be configured to send breaker failure signals to the primary bus protection relay PPR-B 340. Upon receipt of the breaker failure signal, the bus protection relay 340 may signal MU 330 to open breaker 124 and/or breaker 122, to remove power from the faulted feeder.

The primary bus protection relay PPR-B 340 may be configured to provide protective functions to the bus 104. PPR-B 340 may be a primary protection relay capable of obtaining power system measurements and providing protective functions without communication with any monitoring or other supervisory system. PPR-B 340 may obtain electric power system measurements related to electric power, entering and leaving the protected bus 104 using merging units (and in some embodiments may be able to obtain signals from instrument transformers such as CTs, PTs, or the like). As illustrated, PPR-B 340 may include a number of communication ports 302, 304, 306, 308, 310, 312, 314, 316 for receiving power system signals from various other protection devices and/or merging units. The communication ports 302-316 may facilitate communications on optical media, electrical media, or the like. The communication ports 302-316 may facilitate one-way or bi-directional communication. Current measurements on one side of the bus 104 from merging unit 330, which obtains current signals using CT 114, may be provided to the PPR-B 340 via communication port 302. Voltage measurements may be obtained via communication port 304 from merging unit 332, which obtains voltage signals from the bus 104 using a PT. Measurements of current on the other side of the bus 104 may be obtained via ports 308-316 from merging units 372, 374, 376, 378, which obtain current signals from the feeders using CTs. The bus protection relay 340 may use the currents and/or voltages to perform various protection functions such as, for example: overcurrent (phase, ground, neutral); breaker failure; time-overcurrent; current differential; undervoltage; overvoltage; and the like. The bus protection relay 340 may be configured to protect a zone of the electric power delivery system such as, for example, between circuit breaker 124 and breakers 182-188. The bus protection relay 340 may be configured to detect an event using the currents and/or voltages, and send a trip command to one or more circuit breakers to remove power from a portion of the power system affected by the event. For example, the bus protection relay 340 may determine that a fault is present on bus 104 using current differential protection principles, and command breaker 124 to open (e.g., either via direct communication or via merging unit 330) to remove electric power from the faulted bus 104. The bus protection relay 340 may further command breakers 182-188 to open (either via direct communication or via merging units 372-378) to limit potential backfeed from the feeders into the faulted bus 104.

Similar to the primary protection relays 320 and 362-368, the bus relay is configured to continue providing protective functions to the power system regardless of availability of any integrator, monitoring, automation, or supervisory systems or devices. In various embodiments described herein, the primary protection relays 320, 340, 362-368 may be configured to primarily perform protective functions, with secondary functions being removed to a separate device such as the integrator 350. For example, calculating, time stamping, and time aligning synchrophasors may be unnecessary for protective functions, and thus removed to the integrator 350. Similarly, many communications functions such as formatting communications to correspond with supervisory protocols may be removed to the integrator 350.

Some primary protection functions may be performed by a combination of primary protective relays. For this, the system may include some communication between primary protection relays. As illustrated, a dedicated communication pathway 370 is configured between feeder relay 368 and bus relay 340. Although a single communication pathway between one feeder relay and the bus relay is illustrated, several primary protection relays may be in similar communication. The communication may be peer-to-peer, high speed, and/or operate on optical or electrical media. The communication may operate in accordance with the MirroredBits® protocol available from Schweitzer Engineering Laboratories, Inc. of Pullman, Wash. In some embodiments, the communication may facilitate primary protection functions such as, for example, transfer trip, blocking, interlocking, permissive schemes, direct control, relay-to-relay communications, or the like. In the illustrated example, the communication 370 may be useful for direct transfer tripping by the bus relay 340 in the event of breaker failure detection by the feeder relay 368. Thus, the bus relay 340 may clear a fault by opening breaker 124 and/or 122 in the event that breaker 188 does not trip.

The integrator 350 may be configured to communicate monitoring, automation, and supervisory information to the primary protection relays, and to facilitate communications among the primary protection relays. For example, the integrator 350 may be configured to perform breaker failure analysis to determine if a breaker has operated after a signal has been sent to open the breaker. If the integrator 350 determines that the breaker has not opened, it may send a signal to the merging unit and/or to the appropriate primary protective relay to attempt to open the breaker. The integrator 350 may also signal a second breaker to open, where the second breaker is positioned to also remove power from the affected portion of the electric power delivery system. For example, upon failure of breaker 182, the integrator 350 may signal for breaker 122 or 124 to open, removing power from the bus 104 and related feeders.

The integrator 350 may further be configured to send specified communications from certain primary protection relays to appropriate receiving primary protection relays. For example, bus 104 voltage measurements from the primary bus protection relay PPR-B 340 may be useful for certain protection operations of the feeder protection relays 362-368 (in various embodiments, the voltage measurements may be sent directly from the MU 332 to the integrator 350). Accordingly, the integrator 350 may be configured to send bus voltage measurements from PPR-B 340 to each of the feeder protection relays 362-368 by routing such voltage measurements to the communications ports associated with each of the feeder protection relays 362-368.

Communications between the primary protection relays and the integrator 350 may be bi-directional. In various embodiments, the integrator 350 may include multiple communications ports, each associated with a different primary protection relay. Each communications channel may be synchronous or asynchronous. Each communications channel may be deterministic such that communications among primary protection devices is deterministic. With different communication ports in communication with different primary protection relays, the integrator 350 may be easily configured to route specific communications among different primary protection relays by simply routing the communications between different communication ports.

Communications between the various merging units and primary protection relays may be bi-directional. For example, the merging units may send signals related to electric power system measurements and equipment status using a predetermined protocol. Primary protection relays may send commands to the connected merging units (such as open, close, step up, step down, and the like) using the predetermined protocol. The merging units signal primary equipment in accordance with the received commands.

Figure 4:
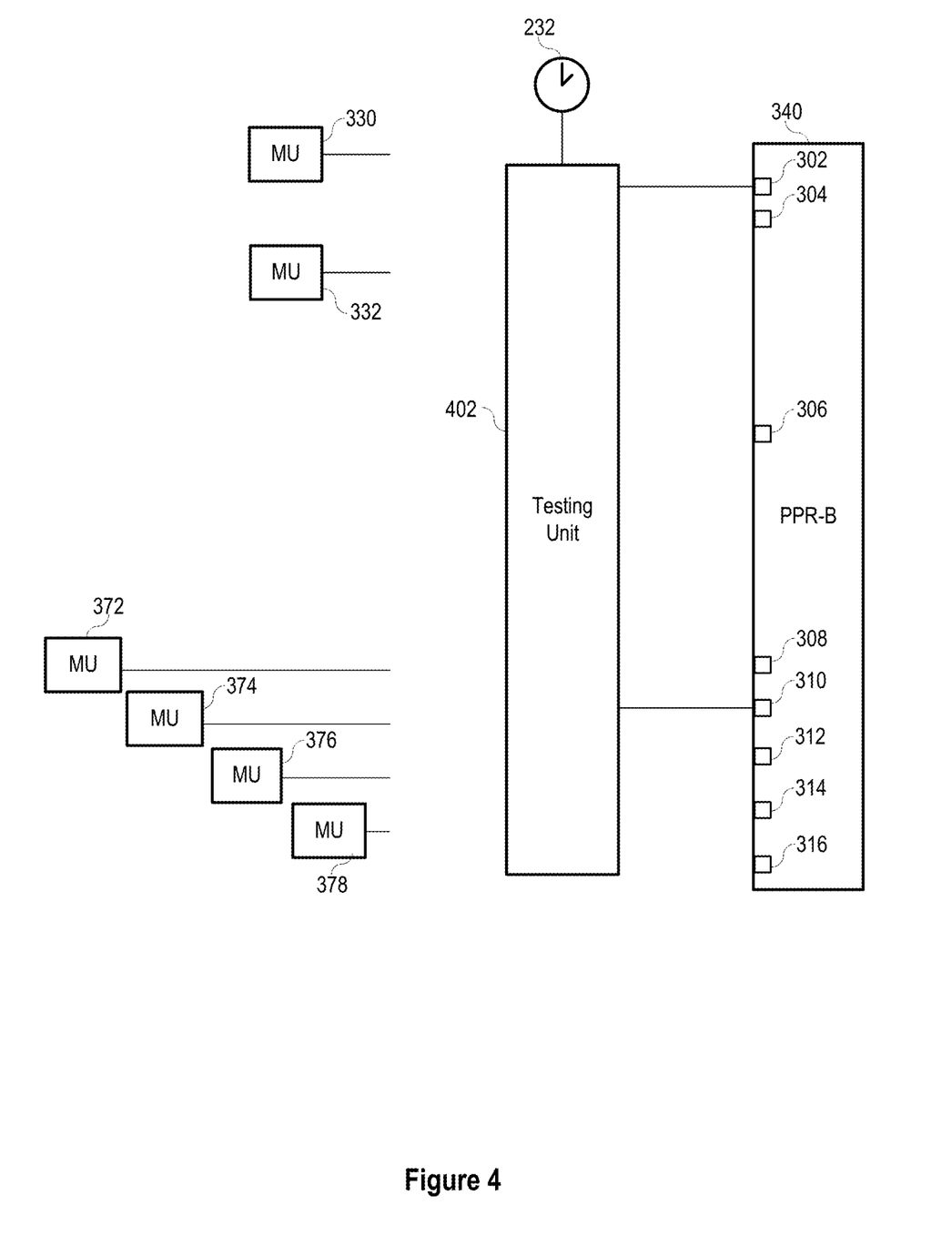
FIG. 4 illustrates a block diagram of a system for commissioning and/or testing the primary protection relay of FIG. 3 in accordance with embodiments of the disclosure.

FIG. 4 illustrates a testing unit 402 and a system for testing a bus protection relay 340 in accordance with embodiments herein. Instead of providing signals to merging units, the testing unit 402 of the present disclosure provides signals directly to the bus protection relay 340. The testing unit 402 may be configured to provide signals similar to those typically provided by the merging units, and in accordance with the predetermined protocol. In some embodiments, the merging units 330, 332, 372-378 may be disconnected from the bus protection relay 340, and the testing unit 402 connected to the bus protection relay 340 in place of one or more of the merging units, depending on the test to be performed. Use of the testing unit 402 may greatly simplify testing of a protective device, as a single testing unit 402 may only be needed. Further, the testing unit 402 may be used at the same location of the bus protection relay 340.

The testing unit 402 provides current signals representing current on one side of the bus to the PPR-B 340 using communication port 302. Voltage signals representing a voltage at the bus may also be provided, using communication port 302 or port 304 depending on the configuration of the PPR-B 340. The testing unit 402 may provide current signals representing current on the other side of the bus via communication port 310. As illustrated, current from a single feeder is represented. In various other embodiments, the testing unit 402 may provide current signals representing currents on multiple feeders using multiple of the communication ports 308-316.

As illustrated, the testing unit 402 may be configured to provide to the PPR-B 340 current signals representing current on both sides of the bus. The PPR-B 340 may perform its typical protection calculations on the test signals, and provide outputs depending on the protection calculations. The outputs may be provided to the testing unit 402 via one or more communication ports 302-316. For example, the PPR-B 340 may perform bus current differential protection calculations using the test current signals. Upon detecting an anomaly, the PPR-B 340 may signal a circuit breaker to trip by sending a trip signal to the testing unit 402 using communication port 302 and/or communication port 310.

The testing unit 402 may be configured to provide signals (e.g., output) in a manner that imitates merging units. The signals may include a data stream of simulated instrument transformer signals, breaker status binaries, and the like. Accordingly, the PPR-B 340 may not need to change its operation when under test. The testing unit 402 may be configured to receive and record communications from the PPR-B 340 for display and analysis. For example, the testing unit 402 may record control signals sent from the PPR-B 340 along with the times that the control signals are sent. The control signals and times may be used to analyze the functionality of the PPR-B 340, including whether the PPR-B 340 provided the correct control signal for the simulated power system condition, and the timing of the control signal.

Such testing may be performed when commissioning the PPR-B 340 to determine that that the PPR-B 340 is properly set and is operating properly before the PPR-B 340 is commissioned to monitor and protect a power system. Further, such testing may be performed periodically following commissioning to validate that the PPR-B 340 is operating as designed and commissioned. Further still, such testing may be performed upon reconfiguration of the power system and/or the protection system to validate that the PPR-B 340 is operating as designed.

Although the above embodiments are illustrated and described as a testing unit used to test a bus-protection relay, any of the primary protection relays or other protection devices may be tested using the testing unit 402.

Figure 5:
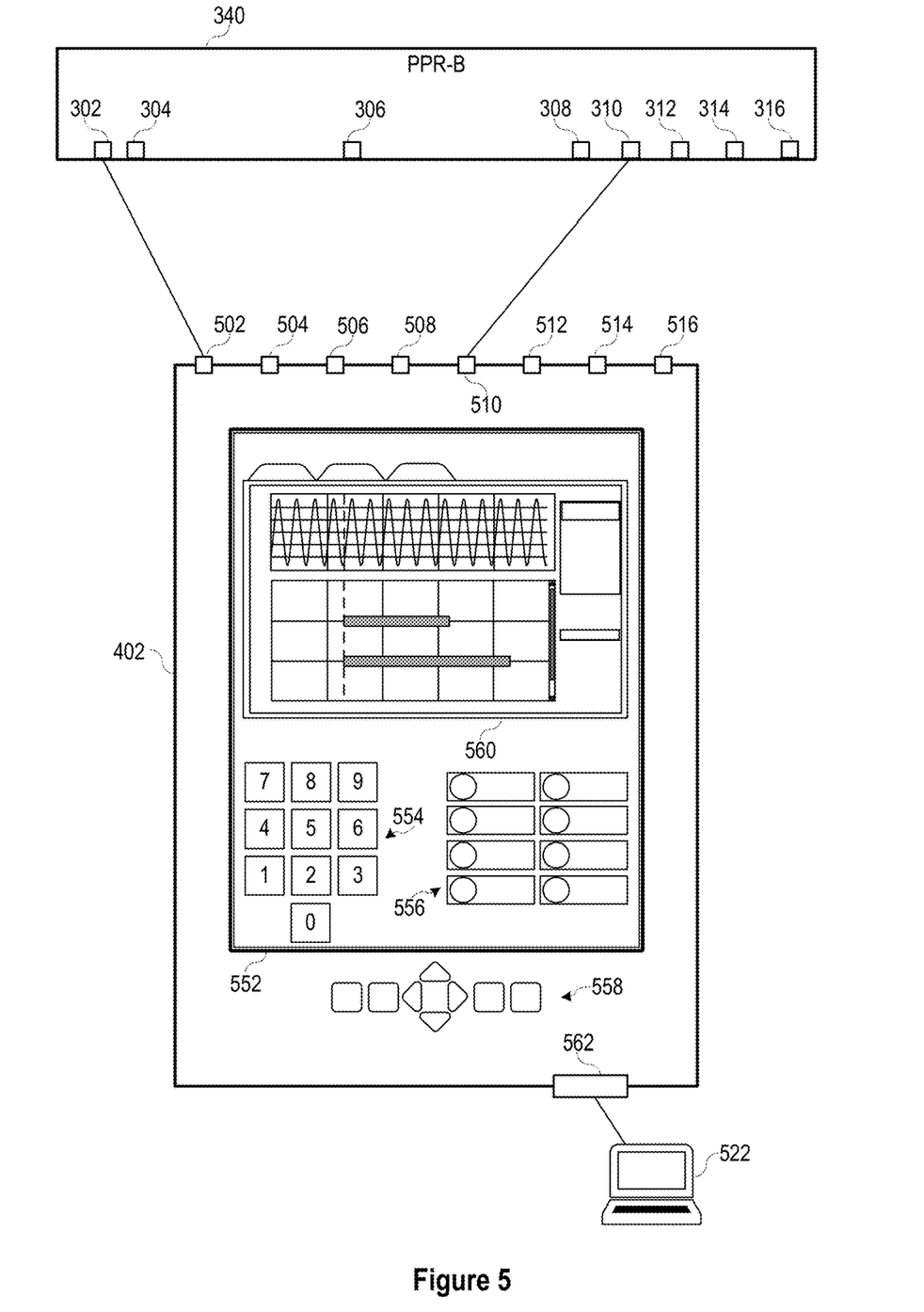
FIG. 5 illustrates a block diagram of a testing unit for testing a primary protection relay in accordance with embodiments of the disclosure.

FIG. 5 illustrates a functional block diagram of a testing unit 402 in accordance with several embodiments described herein. The testing unit 402 includes several communication ports 502-516 for connection to a primary protection device under test, such as the illustrated PPR-B 340. In some embodiments, the communication ports 502-516 may be fiber-optic communication ports configured to transmit and receive signals in accordance with the predetermined communication protocol of the primary protection relay 340.

The testing unit 402 may include a human-machine interface (HMI) for receiving inputs and providing feedback to a user. In the illustrated embodiment, the HMI includes a screen 552. The screen 552 may be a touchscreen such that options may be displayed, and various inputs may be provided via touch by a user. For example, the screen 552 may optionally display a keypad 554 to display numerical values selectable by touch. The keypad 554 display may be provided when numerical value inputs are an option, and hidden when such inputs are not an option in accordance with the operation of the testing unit 402.

The testing unit 402 may display via the screen 552 a number of labeled buttons 556. The labeled buttons 556 may include a variety of predetermined testing scenarios that are selectable by touch. The labeled buttons 556 may include a variety of testing parameters, conditions, signals, and the like that are selectable by touch. The options presented via the labeled buttons 556 may be predetermined or may be configurable.

In various other embodiments, the HMI may include a physical keypad and/or physical labeled buttons outside of the screen 552. Such physical keypad and/or physical labeled buttons may be used in the same manner as the display 554, 556.

The screen 552 may include a display section 560 for providing graphical or other information related to the operations of the testing unit 402. The display section 560 may include tabs for different displays. The display section 560 may provide a graphical or other representation of the signals provided to the primary protection relay under test. The display section 560 may provide a graphical or other representation of commands received from the primary protection relay under test. For example, the display section 560 may include a display of a current waveform over time provided to the primary protection relay under test, along with the asserted protection elements provided by the primary-protection relay to the testing unit 402.

In some embodiments, a display may include a number of icons representing different available operations of the testing unit 402. Some examples of different icons and operations may be a communication port setup (e.g., to configure communications related to the communication ports), test configuration (e.g., to configure the test), predetermined tests (e.g., to select between different predetermined tests), and the like.

Different displays may be selected using different tabs either by touch screen or by other input.

The HMI may include a number of physical buttons 558 for a user to provide inputs and/or selections. In various embodiments, the physical buttons 558 may be labeled. In various embodiments, the functions of the pushbuttons may be indicated on the screen 552. The physical buttons 558 may include direction selection buttons for navigating options on the screen 552.

The testing unit 402 may include a communications port 562 for connection with a computer 522, such as a laptop, desktop, tablet, or other general-purpose or specific-purpose device capable of executing software for interfacing with the testing unit 402. The communications port 562 may be configured in accordance with a preferred computer communications protocol. In accordance with some embodiments, the testing unit 402 may be configured to provide tests under the control of a connected computer 522. In several embodiments, the connected computer 522 may be used to provide details of one or more tests to the testing unit 402 to be run by the testing unit 402. In some embodiments, the testing unit 402 may execute testing procedures under the control of the computer 522. In other embodiments, the testing unit 402 may execute testing procedures independent of the computer 522.

The testing device 402 may be operable in a paired mode, where the testing device 402 cooperates with a computer 522 during testing. In the paired mode, the testing device 402 may apply signals and receive communications as required by the connected computer 522. That is, the computer 522 may provide the testing procedure, and the testing device 402 may apply signals to the device under test in accordance with the procedure provided by the computer 522. A user may enter or select a testing procedure using software installed on the computer 522. The software may include predetermined testing procedures. The software may allow for user-configured testing procedures. The software may include a user interface that includes a table for inputting analog values as phasors. The computer 522 and/or the testing device may convert the analog values to streams of values to be sent to the device under test. Signals received from the device under test may be obtained by the testing device 402, recorded by the testing device 402, displayed by the testing device 402, and transmitted to the computer 522 for evaluation, storage, and/or display.

The testing device 402 may be operable in an independent mode, where the testing device 402 operates without connection to a computer 522 during testing. The Testing device 402 may be pre-set with testing procedures from the computer 522. The testing device 402 may be pre-set with testing procedures from the manufacturer. The testing device 402 may receive a user input to define testing procedures. The testing device may include computer instructions that, when executed by a processor or controller of the device, cause the device to display a user interface that includes a table for inputting analog values as phasors. The testing device 402 may then convert the analog values to streams of values to be sent to the device under test.

In several embodiments, the testing device 402 and/or the computer 522 may include a user interface that synchronizes the user interface and value entry interface with the merging unit that is being imitated. The testing device 402 and/or the computer 522 may read the merging unit settings and then the interface could be set to match those settings. For example, settings such as currents but no voltages connected, number of binaries out and in, and the like may be selected. In various embodiments, the merging unit(s) to be imitated may be connected to the testing device 402. The testing device 402 may include a command to synchronize with the merging unit, whereby the testing device 402 reads the configuration of the merging unit(s) and prepares a simulation environment to match the configuration(s) of the merging unit(s). Accordingly, the interface of the testing device 402 may be configured to match the equipment under test and all entry labels to match the settings that are being tested. This may eliminate confusion over mapping values from one name to another or disabling functions that are not used in the testing procedure.

In various embodiments, the testing device 402 may be a handheld device. Accordingly, the testing device 402 may be carried by a technician and used without additional devices or equipment. In various embodiments, the testing device 402 may be configured with predetermined testing procedures, which may be carried out by a technician.

In some embodiments the device under test may include a test port for communication with the testing device 402 instead of connecting the testing device 402 with specific communication ports (e.g. 302-316) of the device under test.

Figure 6:
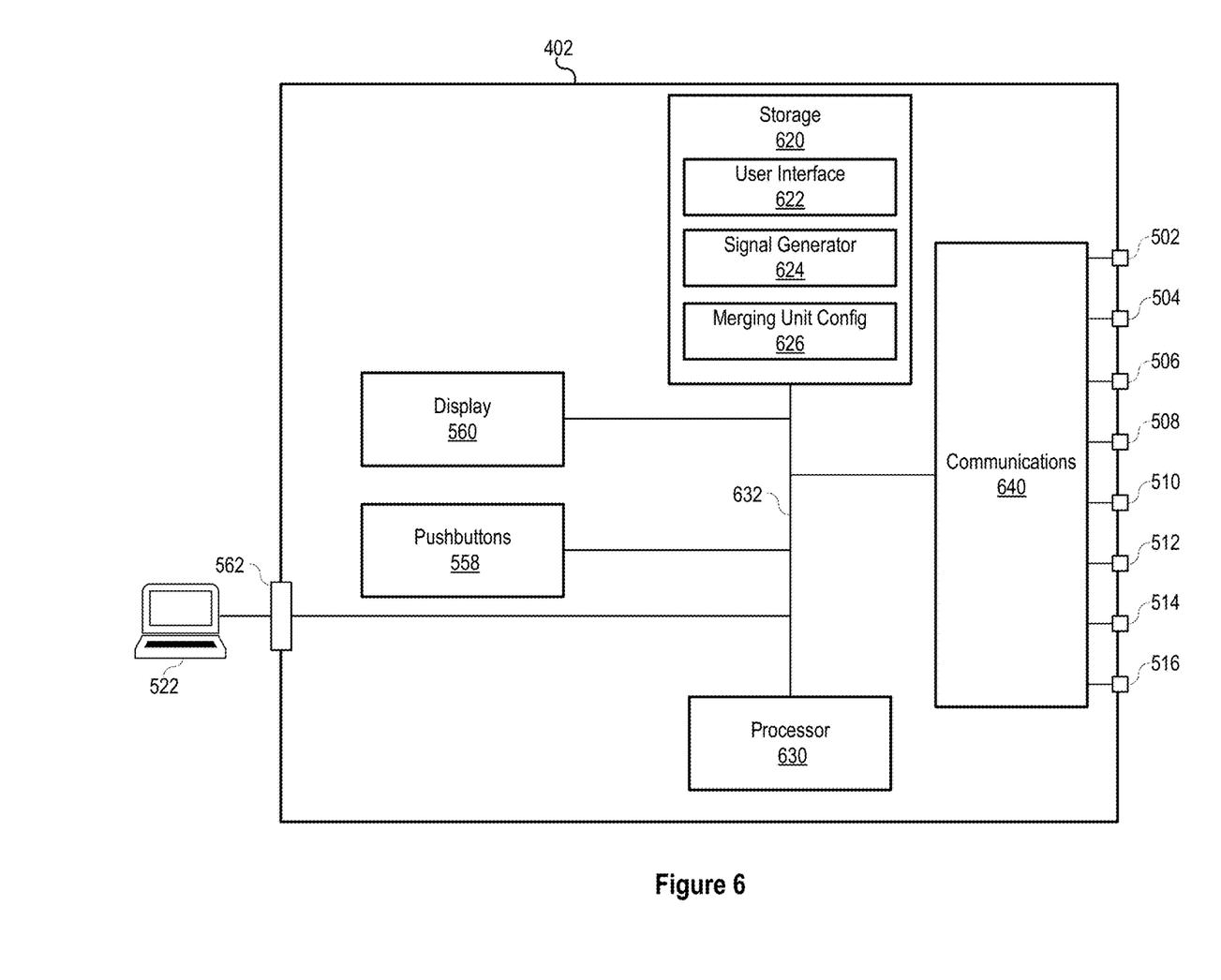
FIG. 6 illustrates a functional block diagram of a testing unit for testing a primary protection relay in accordance with embodiments of the disclosure.

FIG. 6 illustrates a simplified block diagram of a testing device 402 for testing a primary bus protection relay in accordance with several embodiments herein. The device may operate by executing computer instructions on a processor 630, which may be a microprocessor, field-programmable gate array (FPGA), application specific integrated circuit (ASIC), or the like. The testing device 402 may include a non-transitory computer-readable storage unit 620 capable of storing computer instructions for execution by the processor 630. In various embodiments, the storage 620 may be packaged with, or embodied in the processor, while in other embodiments, the storage 620 may be accessible by the processor 630 via a bus 632. Various other components may also be accessible by the processor 630 via the bus 632 or separate communications hardware. The device may include a communications module 640 in communication with the various communications ports 502-516. The communications module 640 may transform computer instructions into a format associated with the communications media and protocol. In various embodiments, separate communications modules may be used for each communication port 502-516. In embodiments where the communication ports 502-516 are fiber-optic communication ports, the communications module 640 may comprise light-emitting devices for transforming the generated electrical communication signals from the processor into light for transmission to the primary bus protection relay. Further, the communications module 640 may include light detection media for receiving communications from the primary bus protection relay and transforming the light into electrical signals to the processor 630.

As illustrated, the processor 630 may execute computer instructions stored on the storage 620. The computer instructions may include instructions for performing a variety of tasks such as generating and displaying the user interface 622. As indicated above, the testing device 402 may include a display 560 for display of the user interface. In embodiments where the display 560 includes a touchscreen, the user interface instructions 622 may also include instructions for receiving input from the display.

The storage 620 may also include signal generator instructions 624 for generating the signals to the primary protection relay and receiving signals from the primary protection relay. The signal generator 624 may format signals to be sent. The signal generator 624 may translate user input signals into communicated signals. The signal generator 624 may imitate signals from one or more merging units previously connected to the primary protection relay. The signal generator 624 may be configured to generate current signal communications related to test current on one side of a bus for communication to the primary protection relay via a first communication port (e.g. port 502) and current signal communications related to test current on the other side of the bus for communication to the primary protection relay via a second communication port (e.g. port 510). The current signals on the second side of the bus may be provided on several communications ports, where signals from multiple feeders are intended to be imitated. The signal generator 620 may further be configured to generate signal communications related to a test voltage on the bus to be communicated to the primary protection relay via one of the communications ports 502-516.

The storage 620 may further include merging unit configuration 626. In embodiments where the testing device 402 is configured to imitate specific merging units, the configuration of such merging units may be stored in the merging unit configuration 626. The merging unit may be temporarily connected to the testing device 402 via a communication port 502-516, whereupon the testing device receives the configuration of the merging unit, and stores the configuration in 626. The configuration may be used by the signal generator 624 to imitate the communications from the merging unit to the primary protection relay. In other embodiments, the primary protection relay may provide merging unit configuration to the testing device 402 upon connection thereto.

The storage 620 may further store preconfigured testing schemes, user inputs, and other settings from the computer 522 or from a user via the user interface. The storage 620 may store a test that has run for a primary protection relay, along with the communications from the primary protection relay during the test. The relative times of the signals sent to the primary protection relay may be stored, as well as the relative times of communications received from the primary protection relay. Accordingly, the test and response from the primary protection relay may be available for later display, transmission, and evaluation.

In various embodiments, all connections to and between the integrator and connected primary protection relays, and all connections from merging units to the primary protection relays and integrator may be optical. Accordingly, no electrically conductive pathways are provided into a control house or substation housing the primary protection relays and/or integrators. This would reduce the risk associated with high voltages and currents from the power system into the control house or substation.

Figure 7:
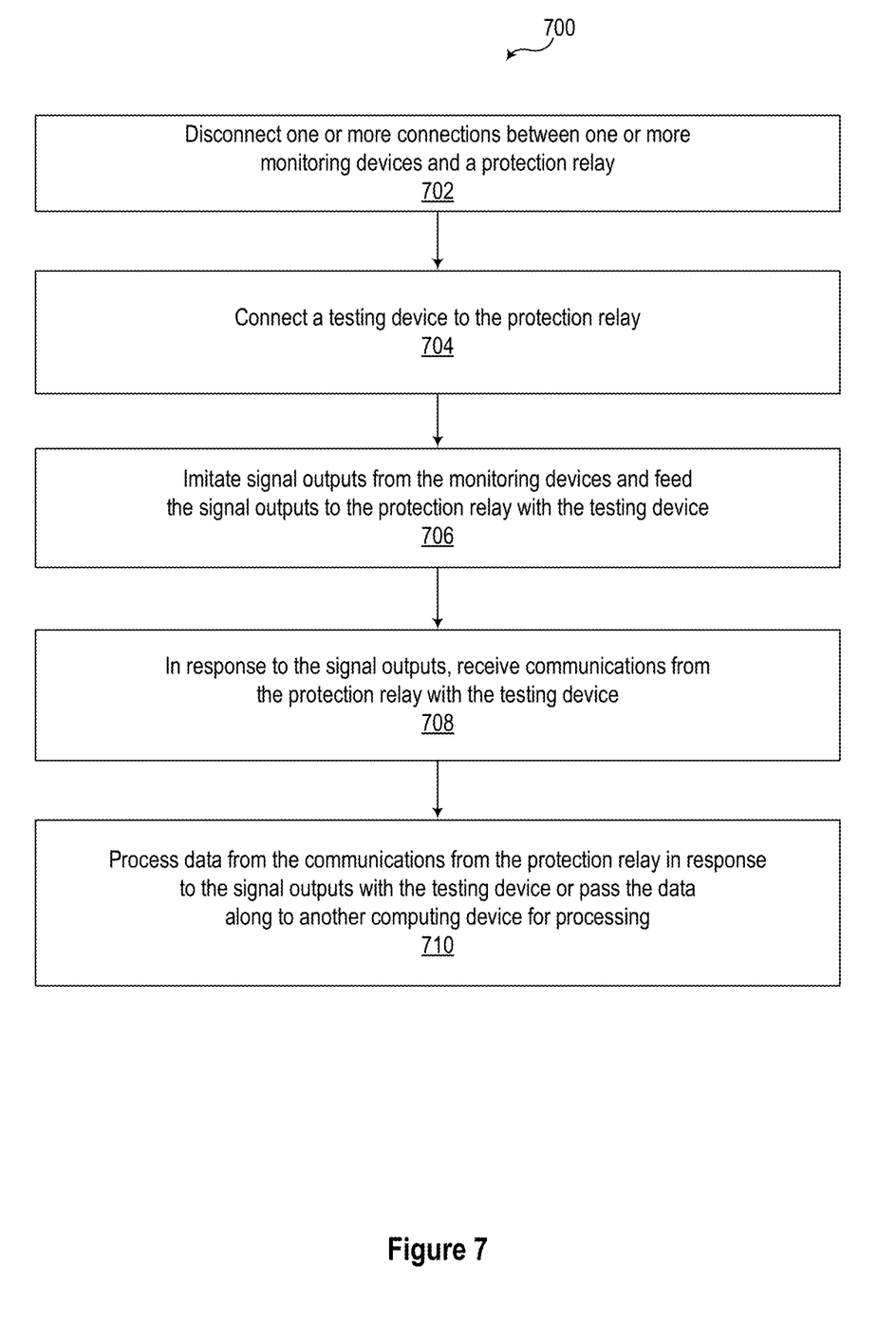
FIG. 7 illustrates a flow chart of a method of testing a protection relay of an electric power delivery system in accordance with embodiments of the disclosure.

FIG. 7 illustrates a flow chart of a method 700 of testing a protection relay of an electric power delivery system.

At 702, one or more connections between one or more monitoring devices and the protection relay may be disconnected. For example, a first connection between a first monitoring device and the protection relay and a second connection between a second monitoring device and the protection relay may be disconnected.

At 704, a testing device may be connected to the protection relay. For example, the testing device may be connected to the first connection in communication with a first port of the protection relay and to the second connection in communication with a second port of the protection relay. In some embodiments, the testing unit may be embodied as any of the testing units discussed herein and may be connected to a bus protection relay. For example, as discussed above, two or more merging units may be disconnected from the bus protection relay and the testing unit may be connected in place of the merging units in order to perform one or more tests on the bus protection relay.

At 706, the testing device may imitate signal outputs from the monitoring devices and feed the signal outputs to the protection relay. For example, the testing device may imitate a first signal output of the first monitoring device and feed the first signal output to the first port of the protection relay. Further, the testing device may imitate a second signal output of the second monitoring device and feed the second signal output to the second port of the protection relay.

At 708, in response to the signal outputs (e.g., the first signal output and the second signal output), the testing device may receive communications from the protection relay.

At 710, the testing device may process data from the communications from the protection relay in response to the signal outputs (e.g., the first signal output and the second signal output) or may pass the data along to another computing device for processing. The response may be verified against an expected response to ensure that the device being tested functions as expected.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present disclosure should, therefore, be determined only by the following claims.

What is claimed is:

1. A device to test a primary bus protection relay of an electric power delivery system, comprising:
    a first communication port to transmit a first test signal to a first port of the primary bus protection relay;
    a second communication port to transmit a second test signal to a second port of the primary bus protection relay, the second communication port being distinct from the first communication port and to communicate with the second port of the primary bus protection relay that is distinct from the first port of the primary bus protection relay that is in communication with the first communication port;
    a non-transitory computer-readable medium to store computer instructions; and
    a processor to execute the computer instructions to:
        generate the first test signal and the second test signal to imitate current over a zone of protection of the primary bus protection relay;
        transmit the first test signal to the first port of the primary bus protection relay via the first communication port;
        separately transmit the second test signal to the second port of the primary bus protection relay via the second communication port;
        receive communication from the first port of the primary bus protection relay in response to the first test signal;
        separately receive another communication from the second port of the second test signal; and
        verify the communication and the another communication from the primary bus protection relay correspond to an expected result.

2. The device of claim 1, wherein the processor executes computer instructions with the first test signal and the second test signal to at least one of an electrical current into a bus or an electrical current out of the bus.

3. The device of claim 2, wherein the processor executes to imitate a fault with the first test signal and the second test signal.

4. The device of claim 1, further comprising a touch-sensitive screen to display the user interface and to receive user input.

5. The device of claim 1, wherein the first communication port and the second communication port each comprise fiber-optic ports.

6. The device of claim 1, further comprising a computer communications port to communicate with an external computer.

7. The device of claim 6, wherein the processor executes computer instructions to receive user input from the external computer to define at least one of the first test signal and the second test signal.

8. The device of claim 6, wherein the processor executes computer instructions to apply the first test signal and the second test signal independent of communication with the external computer.

9. The device of claim 1, wherein the device further comprises a user interface to receive user input to define the test signals.

10. The device of claim 1, wherein the processor for executing the computer instructions is further to generate the first test signal as an imitation of a first signal output from a first merging unit and the second test signal as an imitation of a second signal output from a second merging unit.

11. A system for testing a protection relay of an electric power delivery system, comprising:
    a protection relay comprising one or more ports for communication with a first monitoring device and a second monitoring device of the electric power delivery system; and
    a testing device comprising:
        a communication port to transmit test signals to the one or more ports of the protection relay while the first monitoring device and the second monitoring device of the electric power delivery system are disconnected from the protection relay;
        memory to store computer instructions; and
        a processor to execute the computer instructions to:
            generate a first test signal to imitate a signal output of the first monitoring device;
            generate a second test signal to imitate another signal output of the second monitoring device;
            transmit the first test signal and the second test signal to the protection relay;
            receive communications from the protection relay in response to the first test signal and the second test signal; and
            verify the communications from the primary bus protection relay correspond to an expected result.

12. The system of claim 11, wherein the processor executes computer instructions to imitate at least one of a current signal output or a voltage signal output from the first monitoring device and the second monitoring device.

13. The system of claim 12, wherein the processor executes computer instructions to imitate the signal output from the first monitoring device comprising a merging unit and the second monitoring device comprising a merging unit.

14. The system of claim 11, further comprising a display to present a user interface and to receive user input relating to the first test signal and the second test signal.

15. A method of testing a protection relay of an electric power delivery system, the method comprising:

connecting a testing device to a first connection in communication with a first port of the protection relay;

connecting the testing device to a second connection in communication with a second port of the protection relay;

imitating a first signal output of a first monitoring device and feeding the first signal output to the first port of the protection relay with the testing device along a first communication link while the first monitoring device is disconnected form the protection relay;

imitating a second signal output of a second monitoring device and feeding the second signal output to the second port of the protection relay with the testing device along a second communication link while the second monitoring device is disconnected form the protection relay; and in response to the first signal output and the second signal output, receiving communications from the protection relay with the testing device.

16. The method of claim 15, wherein imitating the first signal output of the first monitoring device comprises emulating a signal output from a first merging unit, and wherein imitating the second signal output of the second monitoring device comprises emulating a signal output from a second merging unit.

17. The method of claim 15, further comprising providing at least one of a current or a voltage in the first signal output and the second signal output.

18. The method of claim 15, further comprising controlling the testing device with an external computer.

19. The method of claim 18, further comprising instructing the testing device to send the first signal output and the second signal output with the external computer based on a user-selected parameter input into the external computer.

20. The method of claim 15, further comprising imitating current output with the first signal output and the second signal output fed into the protection relay comprising a bus relay.

21. The method of claim 15, further comprising imitating a fault with the first signal output and the second signal output fed into the protection relay comprising a bus relay.

* * * * *